United States Patent
Gardner et al.

(10) Patent No.: US 6,197,668 B1
(45) Date of Patent: Mar. 6, 2001

(54) FERROELECTRIC-ENHANCED TANTALUM PENTOXIDE FOR DIELECTRIC MATERIAL APPLICATIONS IN CMOS DEVICES

(75) Inventors: Mark I. Gardner, Cedar Creek; Mark C. Gilmer, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,542

(22) Filed: Nov. 6, 1998

(51) Int. Cl.$^7$ .................. H01L 21/3205; H01L 21/4763

(52) U.S. Cl. ................. 438/585; 438/180; 438/183; 438/299; 438/655; 438/656; 438/243; 438/694; 438/258; 438/648

(58) Field of Search ............................ 438/299, 183, 438/180, 297, 655, 656, 234, 694, 258, 648, 287

(56) References Cited

U.S. PATENT DOCUMENTS

| | | | |
|---|---|---|---|
| 5,365,094 | * | 11/1994 | Takasu . |
| 5,508,953 | * | 4/1996 | Fukuda et al. . |
| 5,763,910 | * | 6/1998 | Ema . |
| 5,858,843 | * | 1/1999 | Doyle et al. . |
| 5,888,296 | * | 3/1999 | Ooms et al. . |
| 5,940,676 | * | 8/1999 | Fazan et al. . |
| 5,972,757 | * | 10/1999 | Ema . |
| 6,002,150 | * | 12/1999 | Gardner et al. . |
| 6,004,878 | * | 12/1999 | Thomas et al. . |
| 6,005,274 | * | 12/1999 | Gardner et al. . |
| 6,015,739 | * | 1/2000 | Gardner et al. . |
| 6,020,024 | * | 2/2000 | Maiti et al. . |
| 6,020,243 | * | 2/2000 | Wallace et al. . |
| 6,022,815 | * | 2/2000 | Doyle et al. . |
| 6,027,961 | * | 2/2000 | Maiti et al. . |

OTHER PUBLICATIONS

Alers et al, "Intermixing at the tantalum oxide/silicon interface in gate dielectric structures," Appl. Phys. Lett. vol. 73, No. 11, pp. 1517, Sep. 14, 1998.*

Park et al, "Leakage current comparison between ultra-thin Ta2O5 films and conventional gate dielectrics," IEEE Elec. Dev. Lett., vol. 19, No. 9, pp. 341, Sep. 9, 1998.*

Park et al, "Transistor characteristics with Ta2O5 gate dielectric," IEEE Elec. Dev. Lett. vol. 19, No. 11, pp. 441, Nov. 1998.*

Luan et al, "Ultra thin high quality Ta2O5 gate dielectric prepared by In-Situ rapid thermal processing," IEEE IEDM 98 pp. 609.*

(List continued on next page.)

Primary Examiner—John F. Niebling
Assistant Examiner—Jonathan Hack
(74) Attorney, Agent, or Firm—Skjerven Morrill MacPherson, LLP; John A. Odozynski

(57) ABSTRACT

In insulated-gate, field effect transistor (IGFET) devices fabricated in integrated circuits, the scaling down of the dimensions of the devices has resulted in structures with dimensions are so small that reproducibility of parameters can become problematic. Specifically, the gate dielectric, typically silicon nitride, silicon oxide or silicon nitride, of a gate structure is nearing the point where the required thickness of the gate dielectric to provide the selected electric field in the channel region is implemented with a few to several atomic layers. In order to improve parameter reproducibility, a dielectric material, such $TaO_5$ or a ferroelectric material, is used as a gate dielectric. $TaO_5$ and the ferroelectric materials have a dielectric constant an order of magnitude higher than the material typically used in the past. Using these materials, the gate dielectric can be proportionately thicker, thereby improving the parameter reproducibility.

12 Claims, 3 Drawing Sheets

Kizilyalli et al, "MOS transistors with stacked SIO2–Ta2O5–SiO2 gate dielectrics for giga–scale integration of CMOS technologies," IEEE Elec. Dev. Lett., vol. 19, No. 11, pp. 423, Nov. 1998.*

Kizilyalli et al, "Stacked gate dielectrics with TaO for future CMOS technologies," 1998 Symp. on VLSI Tech. Digest of Tech. Papers, pp. 216.*

Devoire et al, "On the integration of Ta2O5 as a gate dielectric in sub–0.18 micron CMOS processes," IEEE/SEMI Advanc. Semicond. Manuf. Conf., pp. 434, 1998.*

Wolf, "Silicon Processing for the VLSI Era," vol. 2, pp. 341–346, Sep. 14, 1998.*

* cited by examiner

FERROELECTRIC-ENHANCED TANTALUM PENTOXIDE FOR DIELECTRIC MATERIAL APPLICATIONS IN CMOS DEVICES

BACKGROUND OF THE INVENTION

1. Field of the Invention

This invention relates generally to the fabrication of integrated circuits and, more particularly, to the fabrication of insulated gate, field effect transistor (IGFET) devices.

2. Description of the Related Art

An insulated-gate, field effect transistor (IGFET) device 5, such as a metal-oxide semiconductor field-effect transistor (MOSFET), is shown in FIG. 1. A substrate 10 has a doped well region 12, a p-doped well will be used for purposes of illustration. The substrate 10 has a p-doped channel region 14 that provides a conducting path between the n-doped source/drain region 16A, 16B and the n-doped source/drain region 18A, 18B. In addition, a p-doped punch-through region 20 is provided below the channel region 14. Also formed in the substrate 10 are the isolation structures 22 and 24. The gate structure of the IGFET device 5 includes a gate dielectric region 26, directly over the channel region 14, and a gate electrode 28 over the gate dielectric 26. The gate structure 26, 28 can include spacers 30, 32 formed against the walls of the gate structure 26, 28. An insulating layer 34 covers the substrate 10 and the gate structure 26, 28. The insulating layer 34 has vias formed therein, and the vias are filled with a conducting material. The conducting material 36 provides conducting paths 36 to source/drain (electrode) regions 16A, 16B and 18A and 18B and to the gate electrode 28. An insulating layer 38, formed over insulating layer 34, is patterned, and portions of the photoresist layer removed as a result of patterning are filled with conducting material to provide conducting paths 40. The conducting paths 40 and the remaining insulating material 38 constitute the interconnect layer 38, 40, constitute the electrical coupling between the IGFET device 5 and the remainder of the integrated circuit.

The operation of the IGFET device 5 can be understood as follows. A voltage applied to the gate electrode 28 causes a transverse field in the channel region 14. The transverse field controls (e.g., modulates) the current flow between source/drain region 16A, 16B and source/drain region 18A, 18B. The punch-through region 20 is formed to prevent parasitic effects that can occur when this region is not formed in the device 5. The spacers 30, 32 and the dual-structured, doped source/drain regions 16A, 16B and 18A, 18B address a problem generally referred to as the "hot-carrier" effect. When only one source/drain region 16A and 18A is present and is formed by doping technique aligned with the electrode structure 26, 28, charge carriers from these regions can migrate into the channel region 14 and be trapped by the gate dielectric 26. These trapped charge carriers adversely affect the transverse electric field normally formed in the channel region 14 by a voltage applied to the gate electrode 28. The problem is alleviated by lightly-doping source/drain regions 16A and 18A by a technique which aligns this doping procedure with the gate structure 26, 28. Spacers 30 and 32 are next formed on the walls of the gate structure 26, 28. Source/drain regions 16B and 18B are formed by a doping procedure, resulting in source/drain doping concentrations at normal levels, that aligns the source/drain regions 16B and 18B with the spacers 30 and 32, respectively. (While this two level doping procedure effectively eliminates the "hot-carrier" problem, the resistance between the two source/drain dual regions 16A, 16B and 18A, 18B is increased.) The isolation structures 22, 24 provide electrical insulation between the device 5 and other areas of the integrated circuit.

As the dimensions of integrated circuit devices have been reduced, problems have arisen in the fabrication because of the miniaturization. By way of specific example, as the gate structures in IGFET devices have been reduced, the thickness of the gate dielectric layer has correspondingly been reduced. This layer, fabricated using present techniques, is approaching a thickness of less than 10 Å. At such a thickness, small (and frequently unavoidable) variations in the fabrication of the gate structure can result in a wide variation of parameter values. Specifically, the thickness of the gate dielectric layer determines the capacitance of the gate dielectric layer, and consequently the electric field in the channel region. Because of the requirements for standardization of integrated circuits and their components, these variations can compromise the production of the integrated circuits.

SUMMARY OF THE INVENTION

A need has therefore been for gate structures and an associated technique for the fabrication of gate structures that features a fabrication technique having greater reproducibility of the electrical parameters. It would be another feature of the gate structure and technique of fabrication that thickness of the gate dielectric layer would be increased while maintaining the electrical parameters of the layer. It would be yet another feature of the present invention that process for fabrication of the gate structure be compatible with the present process for fabrication of IGFET devices.

The aforementioned and other features are provided, according to the present invention, by fabricating the gate dielectric layer with $Ta_2O_5$ material, a ferroelectric material, or a combination of the two materials. Because the $Ta_2O_5$ and the ferroelectric materials have high dielectric constants, the gate dielectric layer can be made proportionately thicker and therefore easier to fabricate reproducibly while retaining the selected electrical parameters. These materials are compatible with the materials and processes used in the fabrication of integrated circuits.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
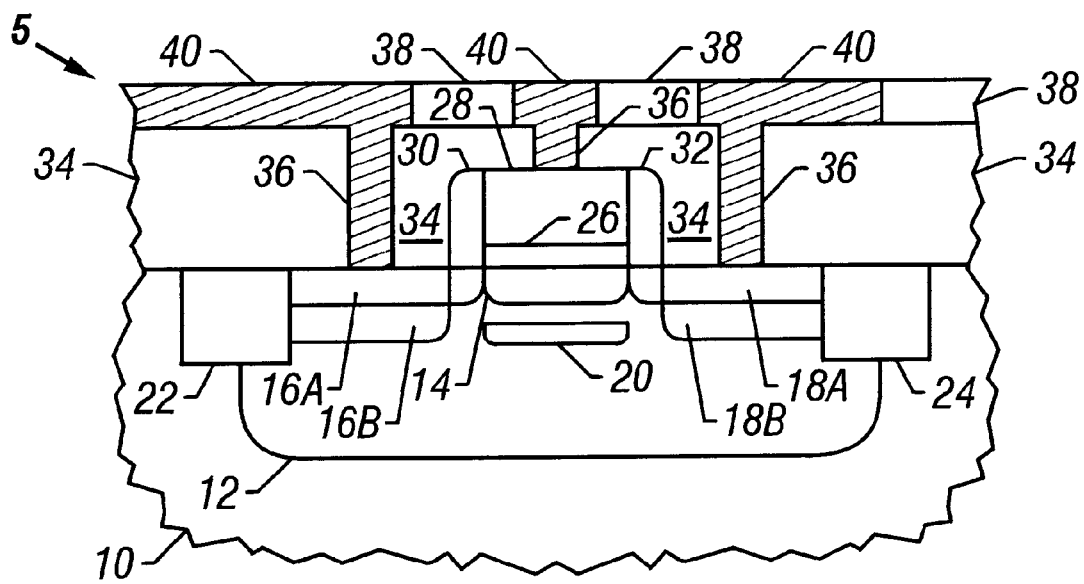
FIG. 1 is a cross-sectional view of a insulated gate, field effect transistor device according to the related art.
Figure 2A:
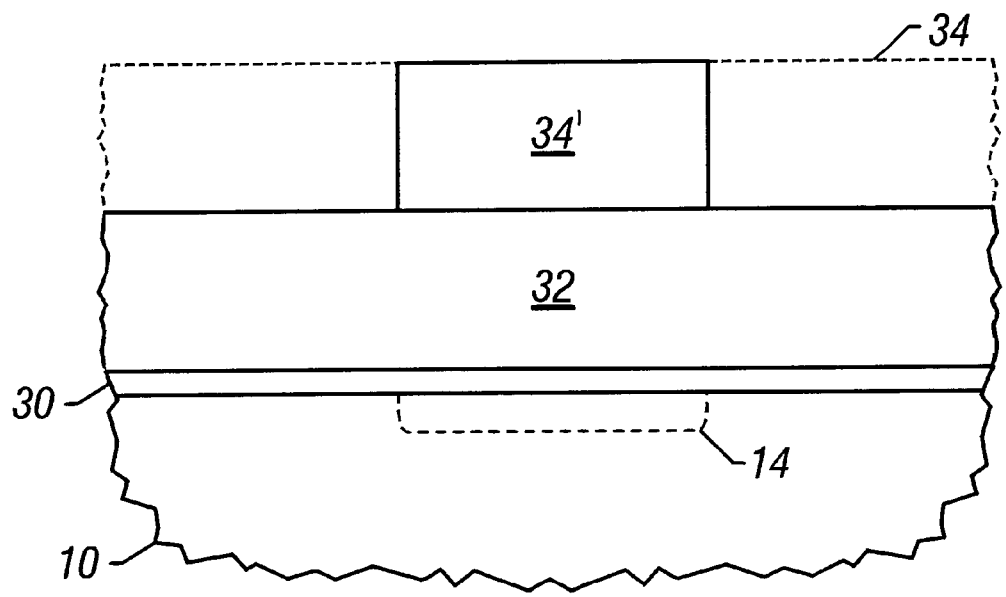
FIG. 2A and FIG. 2B illustrate the process steps in forming a gate structure.
Figure 2B:
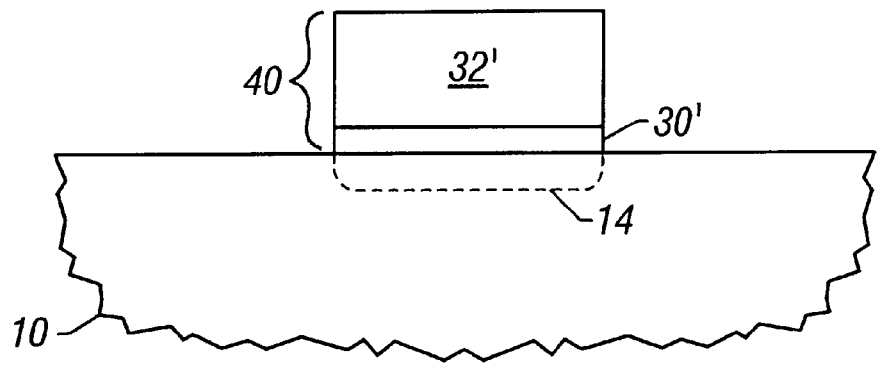

Referring to FIG. 2A and FIG. 2B, a typical process for providing a gate structure is shown. In FIG. 2A, ion implantation into the substrate 10 has formed a well region (not shown), a punch-through region (not shown) and a channel region 14. The substrate thereafter has a gate dielectric layer 30 applied thereto. A gate electrode layer 32 is formed on the gate dielectric layer 30, and a photoresist layer 34 is formed on the gate electrode layer 32. The gate dielectric layer 30 is typically comprised of silicon oxide, silicon nitride or silicon oxynitride. The gate dielectric layer 30 can be formed by deposition on the substrate, growth from the substrate, etc. The gate electrode layer is typically formed from polysilicon or some other conducting material. The photoresist layer 34 is patterned. Predetermined portions of the photoresist layer $34^1$ remain after patterning. The remaining photoresist layer $34^1$ is used as a mask to create, inter alia, the gate structure. An anisotropic etch removes the portion of the gate electrode layer 32 and the gate dielectric layer 30 not shadowed by the photoresist layer $34^1$. Referring next to FIG. 2B, the resulting gate structure 40, comprised of the remaining gate electrode layer $32^1$ and the remaining gate dielectric layer $30^1$, after the photoresist layer $34^1$ has been removed. The gate dielectric layer $30^1$, an insulating layer between two conducting layers, i.e., the channel region 14 and the gate electrode, forms a capacitance C. The capacitance determined the electric field experienced by the channel region 14. As the gate capacitance C has become smaller with the miniaturization of the integrated circuits, d, in the formula for capacitance $C=(ke_0A)/d$ (where k is the dielectric constant, $e_0$ is a physical constant referred to as the permitivity of free space, A is the area of the dielectric gate capacitor, and d is the thickness of the dielectric or between the capacitor plates or the thickness of the gate dielectric layer), has been used to control the capacitance value. At present, using the typical materials, the thickness of the gate dielectric can be only a few angstroms, i.e., has thickness of only a few atoms. At this thickness, the concept of capacitance begins to lose a precise definition. In addition, the reproducibility of material layers of such dimensions is difficult, thereby creating uncertainty in the electric field in the channel region.

Figure 3A:
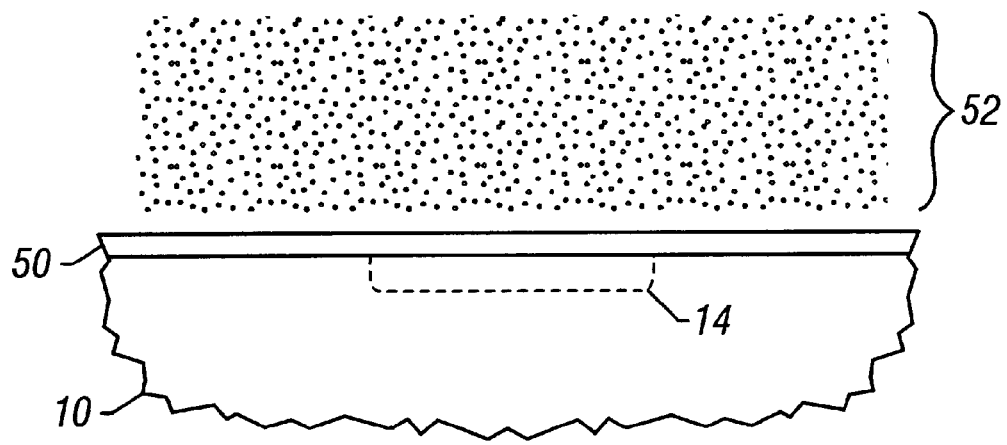
FIG. 3A and FIG. 3B illustrate the process steps in forming a gate structure according to one embodiment of the present invention.
Figure 3B:
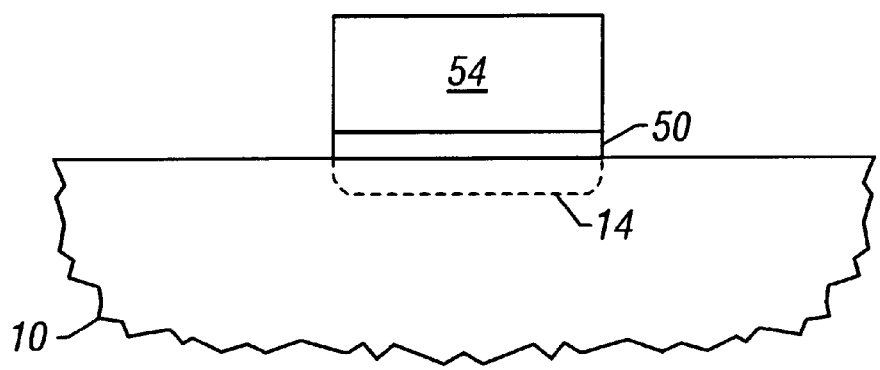

Referring now to FIG. 3A and FIG. 3B, a first embodiment of a gate structure, according to the present invention, is shown. In this embodiment, the gate structure is similar to that shown in FIG. 2B. The gate dielectric layer 30 of FIG. 2B has been replaced, in FIG. 3A, by gate dielectric layer 50 of $Ta_2O_5$. The gate electrode is formed of polysilicon, iridium, tungsten, cobalt or some other conducting material. (In the situation where the gate electrode is polysilicon doped with boron ions, the $Ta_2O_5$ layer 50 is subjected to an atmosphere of $NH_3$ 52 during rapid thermal anneal at a temperature of 900 to 1100° C. In this process, nitrogen is taken into the $Ta_2O_5$ material and the presence of the nitrogen inhibits the dopant, i.e., boron, in the gate electrode from migrating through gate dielectric into the channel region 14.) In FIG. 3B, a gate electrode layer 54 is formed on the $Ta_2O_5$ layer 50 and the two layers are etched to provide a gate structure 50, 54. (As will be clear to those skilled in the art, the use of a polysilicon gate typically involves a salicide process, i.e., the formation of a metal layer over the exposed portion of the gate electrode to which a conducting path is attached. The rapid thermal anneal causes the formation of salicide, e.g., when a cobalt is formed, a $CoSi_2$ layer is formed. After the access metal is removed, a phase change of salicide material can be implemented. The result of these procedures is the formation of a low-resistance contact between the polysilicon gate electrode and a conducting lead.)

The dielectric constant, k, of $Ta_2O_5$ is approximately 25, while the dielectric constant of a typical dielectric gate material is approximately 4. Using the equation for capacitance, to achieve the same capacitance for the same area capacitor, but where $k_2=nxk_1$, then $(k_1e_0A)/d_1=C_1=C_2=(k_2e_0A)/d_2$ implies $k_1/d_1=k_2/d_2$ or $d_2=nxd_1$. That is, when the thickness of a typical gate dielectric material is 4 Å, then a $Ta_2O_5$ gate dielectric thickness of 25 Å will provide the same capacitance.

Figure 4:
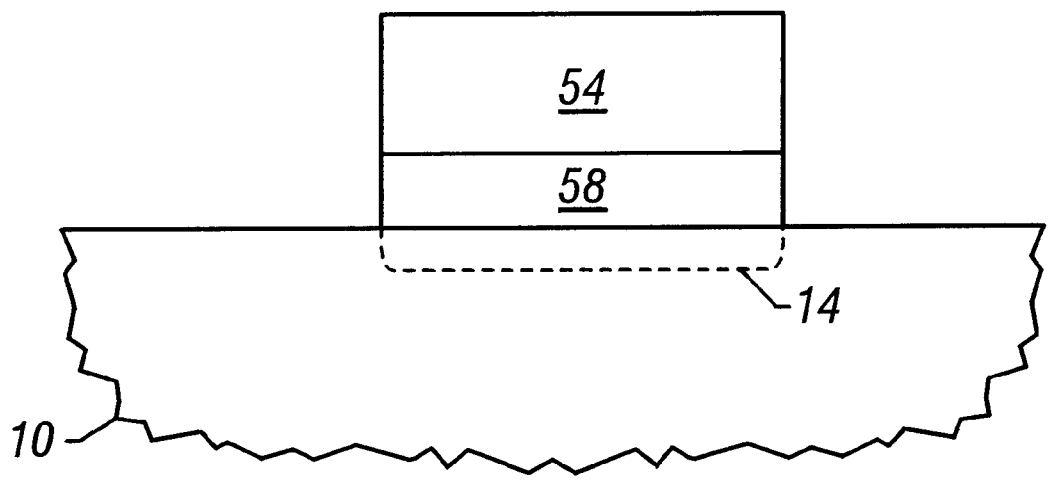
FIG. 4 illustrates a cross-sectional view of a gate structure according to a second embodiment of the present invention.

Referring to FIG. 4, a cross-sectional view of a gate structure is shown that is similar to the gate structure in FIG. 3B. In FIG. 4, the gate dielectric 58 is a ferroelectric material and the gate electrode 54 is a conducting material. Ferroelectric materials have high dielectric constants and can therefore be used to increase further the thickness of the gate dielectric material while maintaining a predetermined value of capacitance. Examples of ferroelectric materials are barium strontium titanate (BST), strontium bismuth titanate (SBT), lead zirconium titanate (PZT), and strontium titanate (ST). (When the gate electrode material is polysilicon, the processes described above, to reduce the migration of boron ions and to reduce the gate electrode contact resistance, can be implemented.)

Figure 5:
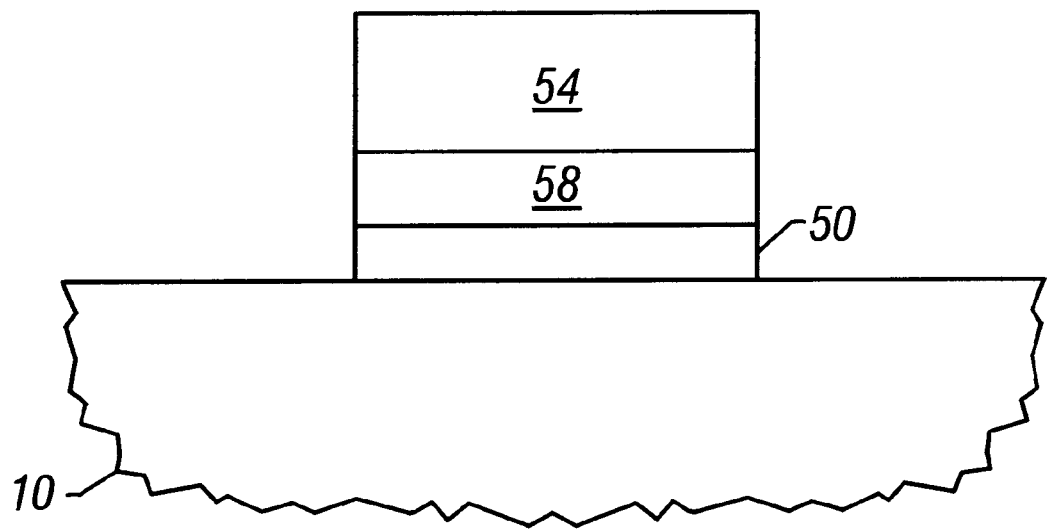
FIG. 5 illustrates a cross-sectional view of a gate structure according to a third embodiment of the present invention.

Referring to FIG. 5, a cross-sectional view of a gate structure is shown that is similar to FIG. 3B and FIG. 4. In FIG. 5, however, the gate dielectric layer includes both $Ta_2O_5$ 50 and a ferroelectric material 58. This combination of materials, as with the individual materials, provides a high dielectric constant gate dielectric layer that can provide a gate dielectric layer with the same physical properties as the thinner layer of a material typically used in a gate structure. (The comments included above, with respect to implementation of the gate electrode structure, are applicable.)

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A method of forming a gate structure for an IGFET device, said method comprising the steps of:

forming an insulating layer of a high dielectric constant material on a substrate, said insulating layer providing the gate dielectric for said gate structure;

embedding nitrogen in said insulating layer;

forming a conducting layer providing a gate electrode for said gate structure; and etching said insulating layer and said conducting layer to form said gate structure.

2. The method as recited in claim 1 wherein said high dielectric constant material is $Ta_2O_5$.

3. The method as recited in claim 1 wherein said high dielectric constant material is a ferroelectric material.

4. The method as recited in claim 3 wherein said ferroelectric material is a material selected from the group consisting of barium strontium titanate, strontium bismuth titanate, lead zirconium titanate, and strontium titanate.

5. The method as recited in claim 1 wherein said high dielectric constant material is combination of a layer of $Ta_2O_5$ and a layer of a ferroelectric material.

6. A method of forming an insulated gate field effect transistor device, said method comprising the steps of:

forming at least a doped channel region in a substrate;

forming a high dielectric constant, insulating material layer on said substrate;

embedding nitrogen in said high dielectric constant, insulating material;

forming a conducting material layer on said high dielectric constant layer; and removing selected portions of said conducting material layer and said high dielectric constant material layer to form a gate structure proximate said channel region.

7. The method as recited in claim 6 wherein said high dielectric constant material is $Ta_2O_5$.

8. The method as recited in claim 6 wherein said high dielectric constant material is a ferroelectric material.

9. The method as recited in claim 8 wherein said ferroelectric material is a material selected from the group consisting of barium strontium titanate, strontium bismuth titanate, lead zirconium titanate, and strontium titanate.

10. The method as recited in claim 6 wherein said high dielectric constant material layer is a combination of a $Ta_2O_5$ material layer and a ferroelectric material layer.

11. The method as recited in claim 10 wherein said ferroelectric material is a material selected from the group consisting of barium strontium titanate, strontium bismuth titanate, lead zirconium titanate, and strontium titanate.

12. A method of forming an IGFET device, comprising the steps:

forming a doped channel region in a substrate;

forming an insulating layer on the substrate, the insulating layer comprising a combination of $Ta_2O_5$ layer and a ferroelectric layer;

forming a conducting layer on the insulating layer; and removing selected portions of said conducting layer and said insulating layer to form a gate structure proximate said channel region.

* * * * *